United States Patent
Khlat

(10) Patent No.: US 11,201,593 B2
(45) Date of Patent: Dec. 14, 2021

(54) DOHERTY POWER AMPLIFIER SYSTEM

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 33 days.

(21) Appl. No.: 16/710,461

(22) Filed: Dec. 11, 2019

(65) Prior Publication Data

US 2021/0184633 A1    Jun. 17, 2021

(51) Int. Cl.
  *H03F 1/02*    (2006.01)
  *H03F 3/213*   (2006.01)
  *H03F 3/195*   (2006.01)

(52) U.S. Cl.
  CPC ........... *H03F 1/0288* (2013.01); *H03F 3/195* (2013.01); *H03F 3/213* (2013.01); *H03F 2200/102* (2013.01)

(58) Field of Classification Search
  CPC ................. H01L 23/66; H01L 23/4952; H01L 2223/665; H01L 2223/6655; H03F 1/0288; H03F 3/211; H03F 3/245; H03F 2200/432; H05K 1/0243
  USPC ....................................................... 330/286
  See application file for complete search history.

(56) References Cited

U.S. PATENT DOCUMENTS

| | | | |
|---|---|---|---|
| 6,356,149 B1 | 3/2002 | Stengel et al. | |
| 7,345,535 B2 | 3/2008 | Kwon et al. | |
| 7,427,895 B1 | 9/2008 | Okubo et al. | |
| 7,786,797 B2 | 8/2010 | Okazaki et al. | |
| 8,115,546 B2 | 2/2012 | Hong et al. | |
| 8,279,009 B2 | 10/2012 | Grondahl et al. | |
| 9,774,299 B2 | 9/2017 | Staudinger et al. | |
| 9,979,352 B2 | 5/2018 | Hur et al. | |
| 2009/0206927 A1 | 8/2009 | Okubo et al. | |
| 2010/0001802 A1* | 1/2010 | Blednov ................. H03F 3/195 330/295 |
| 2014/0132343 A1 | 5/2014 | Colantonio et al. | |
| 2015/0119107 A1 | 4/2015 | Bouny et al. | |
| 2015/0180428 A1 | 6/2015 | Pham et al. | |

(Continued)

OTHER PUBLICATIONS

Non-Final Office Action for U.S. Appl. No. 16/516,774, dated Oct. 5, 2020, 10 pages.

(Continued)

*Primary Examiner* — Hafizur Rahman
(74) *Attorney, Agent, or Firm* — Withrow & Terranova, PLLC

(57) ABSTRACT

A Doherty amplifier system is disclosed with a carrier amplifier configured to amplify a first portion of a radio frequency (RF) signal. A peaking amplifier with a peaking output is configured to amplify a second portion of the RF signal when it is above a power level threshold. A first inductor is coupled between the main output and a first middle node, and a second inductor is coupled between the first middle node and the peaking output. The first inductor and the second inductor are configured to have a first magnetic coupling to form a first impedance inverter. A third inductor is coupled between the peaking output and a second middle node, and a fourth inductor is coupled between the second middle node and an RF signal output. The third inductor and the fourth inductor are configured to have a second magnetic coupling to form a second impedance inverter.

18 Claims, 5 Drawing Sheets

(56) References Cited

U.S. PATENT DOCUMENTS

2015/0229276 A1    8/2015   Shiikuma
2021/0075374 A1*   3/2021   Wang ..................... H03F 3/604

OTHER PUBLICATIONS

Non-Final Office Action for U.S. Appl. No. 16/516,766, dated Dec. 7, 2020, 7 pages.
U.S. Appl. No. 16/516,774, filed Jul. 19, 2019.
U.S. Appl. No. 16/516,766, filed Jul. 19, 2019.
Notice of Allowance for U.S. Appl. No. 16/516,774, dated Feb. 4, 2021, 7 pages.
Notice of Allowance for U.S. Appl. No. 16/516,774, dated Apr. 14, 2021, 7 pages.

\* cited by examiner

DOHERTY POWER AMPLIFIER SYSTEM

RELATED APPLICATIONS

This application is related to U.S. patent application Ser. No. 16/516,766, filed Jul. 19, 2019 and published as U.S. Patent Application Publication No. 2020/0028471, which claims the benefit of provisional patent application Ser. No. 62/701,217, filed Jul. 20, 2018, the disclosures of which are hereby incorporated herein by reference in their entireties.

FIELD OF THE DISCLOSURE

The present disclosure relates to radio frequency amplifier circuitry and in particular to Doherty radio frequency amplifier circuitry with improved performance.

BACKGROUND

Radio frequency (RF) power amplifiers are used to increase the amplitude of RF signals for transmission. One popular type of RF power amplifier is the Doherty amplifier because of its relatively greater efficiency in comparison with many other RF power amplifier types. The Doherty amplifier includes a carrier amplifier and a peaking amplifier. Generally, at output power levels below an average output power level, only the carrier amplifier is active to amplify an RF signal. The peaking amplifier becomes active at an output power level close to around the average power level. As output power increases from activation of the peaking amplifier, the peaking amplifier operates in parallel with the carrier amplifier to amplify the RF signal.

While the relatively greater efficiency of the Doherty amplifier is very attractive, traditional Doherty amplifiers have a relatively limited modulation bandwidth in comparison to the 400 MHz modulation bandwidth Fifth-generation New Radio (5G-NR) applications. What is needed is a Doherty amplifier system that can meet the 400 MHz modulation requirement of 5G-NR.

Summary

A Doherty amplifier system is disclosed with a carrier amplifier having a main input and a main output, wherein the carrier amplifier is configured to amplify a first portion of a radio frequency (RF) signal received at the main input. A peaking amplifier has a peaking input and a peaking output, wherein the peaking amplifier is configured to amplify a second portion of the RF signal when the RF signal is above a power level threshold. A first inductor is coupled between the main output and a first middle node, and a second inductor is coupled between the first middle node and the peaking output. The first inductor and the second inductor are configured to have a first magnetic coupling to form a first impedance inverter. A third inductor is coupled between the peaking output and a second middle node, and a fourth inductor is coupled between the second middle node and an RF signal output. The third inductor and the fourth inductor are configured to have a second magnetic coupling to form a second impedance inverter.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
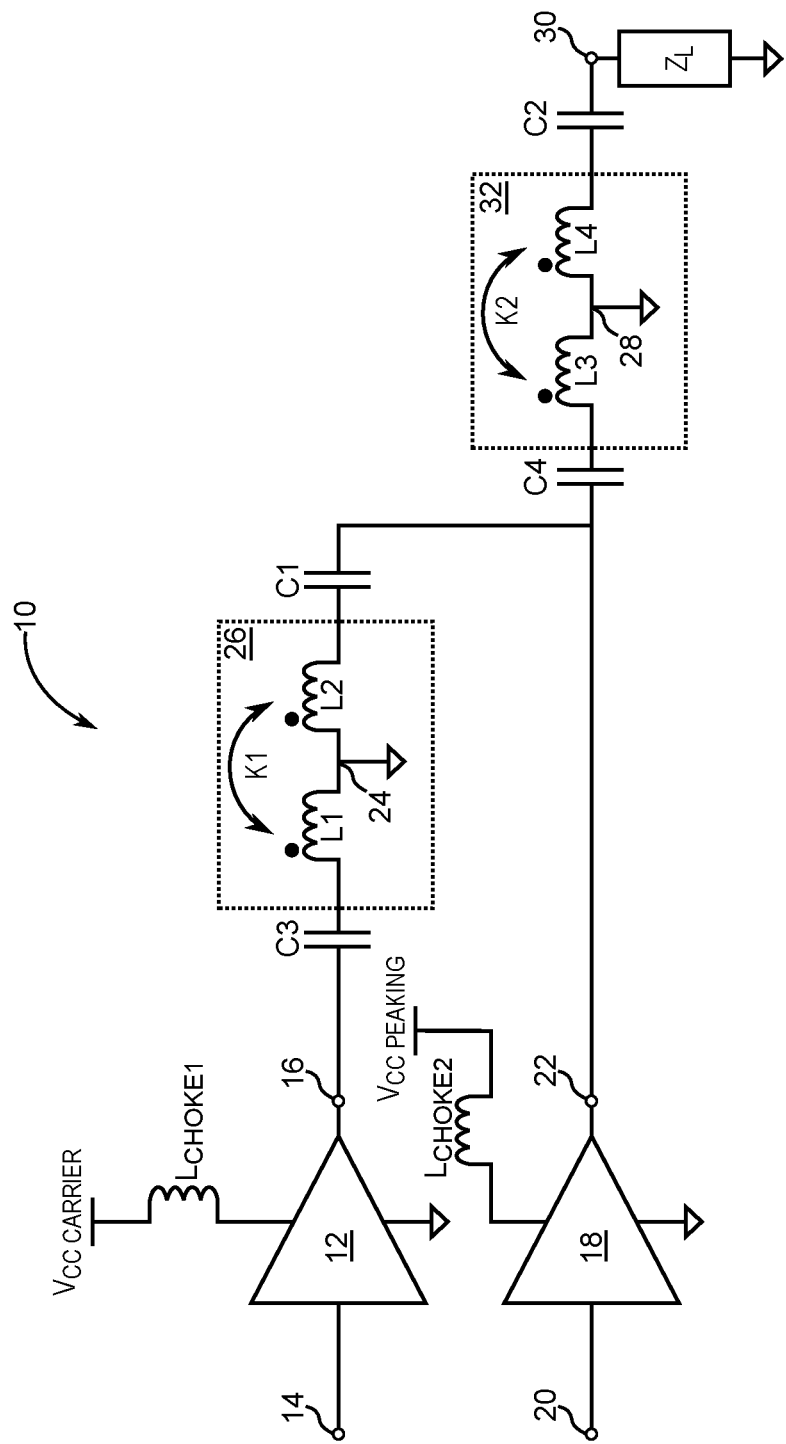
FIG. 1 is a schematic of an exemplary first embodiment of a Doherty amplifier system that is structured in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In accordance with the present disclosure, FIG. 1 is a schematic of an exemplary Doherty amplifier system 10 with a carrier amplifier 12 having a main input 14 and a main output 16, wherein the carrier amplifier 12 is configured to amplify a first portion of a radio frequency (RF) signal received at the main input 14. A peaking amplifier 18 has a peaking input 20 and a peaking output 22, wherein the peaking amplifier 18 is configured to amplify a second portion of the RF signal when the RF signal is above a power level threshold. A carrier supply voltage $V_{CC\ CARRIER}$ powers the carrier amplifier 12 through a radio frequency (RF) choke coil $L_{CHOKE1}$. A peaking supply voltage $V_{CC\ PEAKING}$ powers the peaking amplifier 18 through a second RF choke coil $L_{CHOKE2}$. In at least some embodiments, supply modulations for the carrier supply voltage $V_{CC\ CARRIER}$ and the peaking supply voltage $V_{CC\ PEAKING}$ may be envelope tracking and/or average power tracking and combinations thereof.

A first inductor L1 is coupled between the main output 16 and a first middle node 24, and a second inductor L2 is coupled between the first middle node 24 and the peaking output 22. The first inductor L1 and the second inductor L2 are configured to have a first magnetic coupling K1 to form a first impedance inverter 26. In this particular embodiment, the first middle node 24 is coupled to a fixed voltage node such as ground, which results in current flowing into the dotted end of the first inductor L1 as current is flowing out of the dotted end of the second inductor L2. Thus, the first inductor L1 and the second inductor L2 are negatively magnetically coupled.

A third inductor L3 is coupled between the peaking output 22 and a second middle node 28, and a fourth inductor L4 is coupled between the second middle node 28 and an RF signal output 30. In this particular embodiment the second middle node is coupled to a fixed voltage node such as ground, which results in current flowing into the dotted end of the third inductor L3 as current is flowing out of the dotted end of the fourth inductor L4. Thus, the third inductor L3 and the fourth inductor L4 are negatively magnetically coupled.

The third inductor L3 and the fourth inductor L4 are configured to have a second magnetic coupling K2 to form a second impedance inverter 32. A load $Z_L$ is coupled between the RF signal output 30 and ground.

In the exemplary embodiment of FIG. 1, a first capacitor C1 is coupled between the second inductor L2 and the peaking output 22, and a second capacitor C2 is coupled between the fourth inductor L4 and the RF signal output 30. Moreover, in the particular embodiment of FIG. 1, a third capacitor C3 is coupled between the main output 16 and the first inductor L1, and a fourth capacitor C4 is coupled between the peaking output 22 and the third inductor L3. The first capacitor C1 and the third capacitor C3 are sized to resonate out undesired inductances that may reduce effectiveness of the impedance inversion provided by the first impedance inverter 26. Likewise, the second capacitor C2 and the fourth capacitor C4 are sized to resonate out undesired inductances that may reduce effectiveness of impedance inversion provided by the second impedance inverter 32. Ideally, the first capacitor C1 and the third capacitor C3 have equal capacitance values and the second capacitor C2 and the fourth capacitor C4 have equal capacitance values. Moreover, it is ideal for the first inductor L1 and the second inductor L2 to have equal inductances and for the third inductor L3 and the fourth inductor L4 to have equal inductances.

Note that in some literature, an impedance inverter coefficient K, such as the first impedance inverter coefficient K1 and the second impedance inverter coefficient K2, is also referred to as an impedance inverter constant K. In a basic form, an impedance inverter such as the first impedance inverter 26 and the second impedance inverter 32 can be realized using a quarter-wave transformer, wherein K equals a value of characteristic impedance ZO that provides impedance inversion between an input and an output of the impedance inverter. Ideally, in accordance with the present disclosure, the first impedance inverter coefficient K1 and the second impedance inverter coefficient K2 are numerically equal such that K1/K2 is unity. However, due to tolerances of manufacture, the first impedance inverter coefficient K1 and the second impedance coefficient K2 are not exactly equal. Therefore, some acceptable ranges of near equality have been determined for embodiments of the present disclosure.

In this regard and in at least some embodiments, the first impedance inverter coefficient K1 is numerically within ±10% of the second impedance inverter coefficient K2. In at least some other embodiments, the first impedance inverter coefficient K1 is numerically within ±5% of the second impedance coefficient K2. In yet some other embodiments, the first impedance inverter coefficient K1 is numerically within ±1% of the second impedance inverter coefficient K2. In some embodiments, the first inductor L1, the second inductor L2, the third inductor L3, and the fourth inductor L4 are fabricated from metal layers within a die that integrates the carrier amplifier 12 with the peaking amplifier 18. In at least some exemplary embodiments, individual inductances provided by the first inductor L1, the second inductor L2, the third inductor L3, and the fourth inductor L4 are between 2 nanohenries (nH) and 6 nH. Moreover, in at least some exemplary embodiments, individual capacitances provided by the first capacitor C1, the second capacitor C2, the third capacitor C3, and the fourth capacitor C4 are on the order of picofarads for frequencies of operation between 2.5 GHz and 70 GHz.

In operation, the first portion of the RF signal is amplified by the carrier amplifier 12 and phase shifted by the first impedance inverter 26. The second portion of the RF signal is amplified by the peaking amplifier and combined with the phase shifted and amplified first portion of the RF signal at the peaking output 22.

Figure 2:
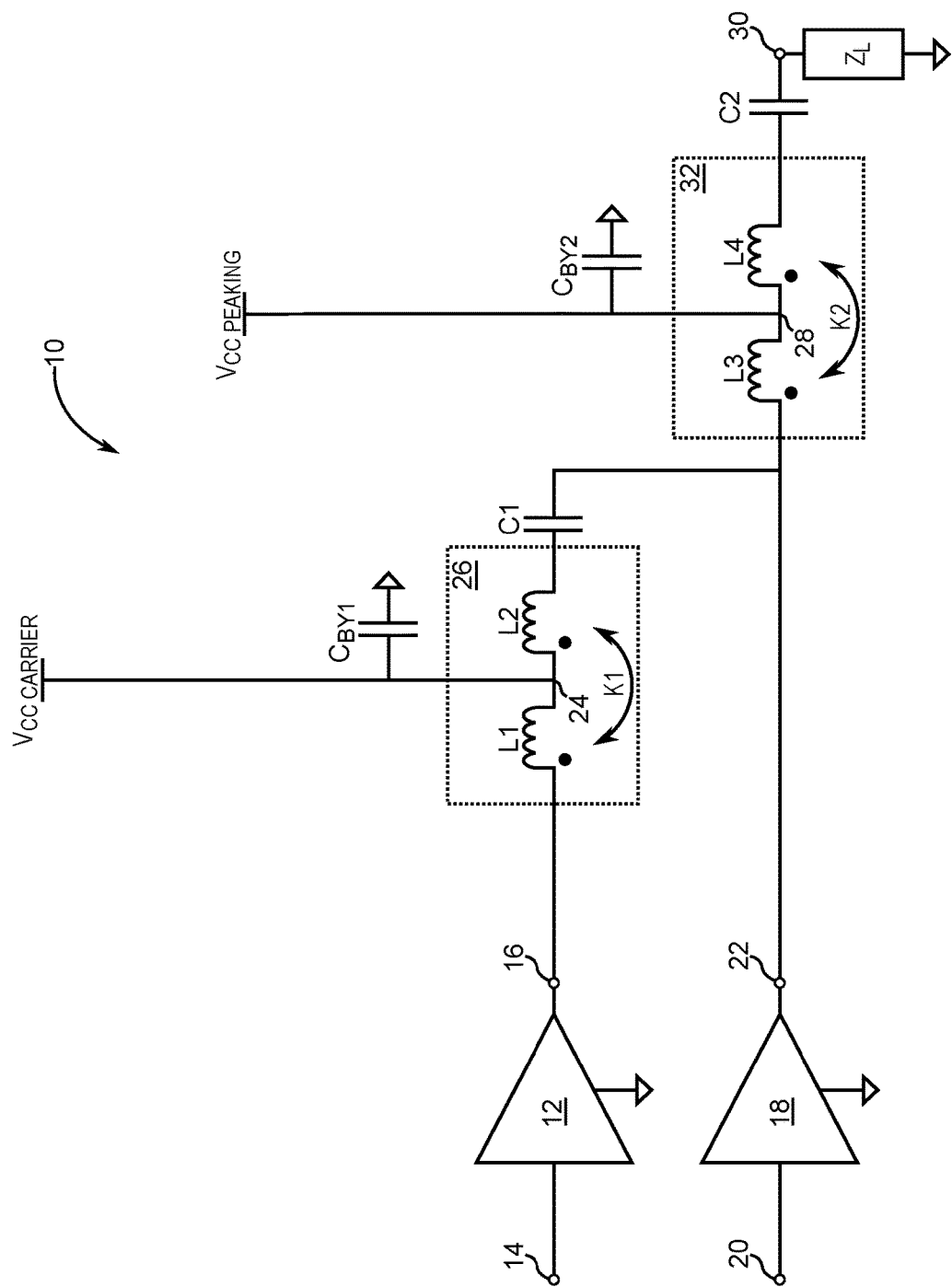
FIG. 2 is a schematic of an exemplary second embodiment of the Doherty amplifier system that is modified to replace radio frequency choke coils of the first embodiment with inductors of impedance inverters.

FIG. 2 is a schematic of an exemplary second embodiment of the Doherty amplifier system 10 that is modified to replace the first RF choke coil $L_{CHOKE1}$ (FIG. 1) and the second RF choke coil $L_{CHOKE2}$ with the first inductor L1 of the first impedance inverter 26 and the third inductor L3 of the second impedance inverter 32, respectively. In this exemplary embodiment, the third capacitor C3 is eliminated so that the first inductor L1 is direct current coupled to the main output 16 of the carrier amplifier 12. In this configuration, the carrier supply voltage $V_{CC\_CARRIER}$ powers the carrier amplifier 12 through the first inductor L1. Furthermore, in this exemplary embodiment, the fourth capacitor C4 is eliminated so that the third inductor L3 is direct current coupled to the peaking output 22 of the peaking amplifier 18. In this configuration, the peaking supply voltage $V_{CC\_PEAKING}$ powers the peaking amplifier 18 through the third inductor L3. Benefits from eliminating the first RF choke coil $L_{CHOKE1}$ and the second RF choke coil $L_{CHOKE2}$ combined with reuse of both the first inductor L1 and the third inductor L3 include reduced cost due to reduced component count and a reduction real estate requirement. Other modifications include a first RF grounding capacitor $C_{BY1}$ coupled between the first middle node 24 and the fixed voltage node, and a second RF grounding capacitor $C_{BY2}$ coupled between the second middle node 28 and the fixed voltage node, which in this case is ground.

Figure 3:
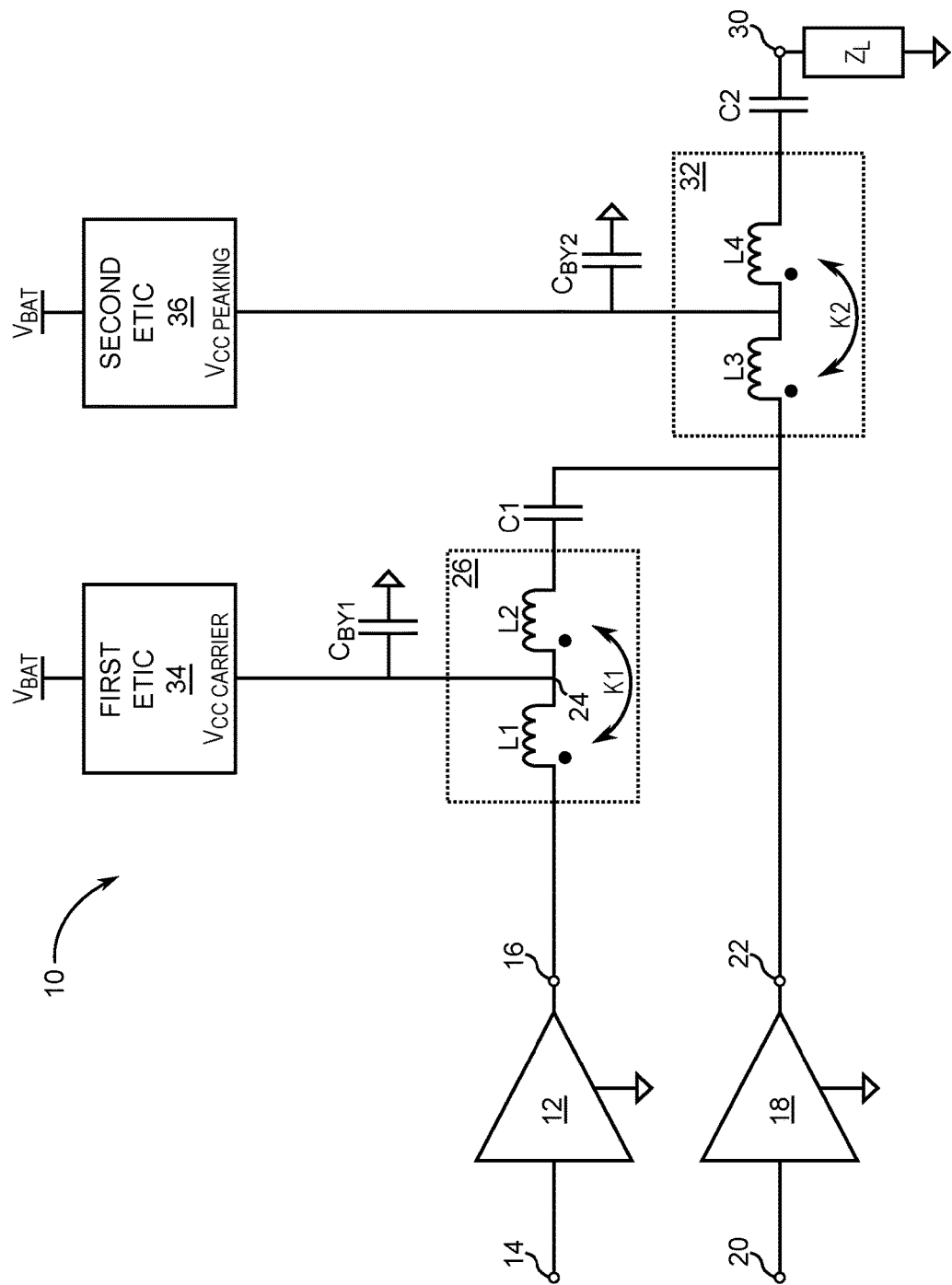
FIG. 3 is a schematic of the exemplary second embodiment of the Doherty amplifier system that is configured to operate with improved power efficiency through the use of supply voltage modulation provided by envelope tracking integrated circuits.

FIG. 3 is a schematic of the exemplary second embodiment of the Doherty amplifier system 10 that is configured to operate with supply voltage modulation for improved power efficiency. In this case, a battery voltage $V_{BAT}$ is modulated by a first envelope tracking integrated circuit (ETIC) 34 that is configured to output the carrier supply voltage $V_{CC\_CARRIER}$. A second ETIC 36 is configured to modulate the battery voltage $V_{BAT}$ and output the peaking supply voltage $V_{CC\_PEAKING}$. Both, the first ETIC 34 and the second ETIC 36 may be further configured to operate under a plurality of tracking modes that include but are not limited to envelope tracking and average power tracking modes. An appropriate tracking mode for a particular envelope tracking environment is selected from the plurality of tracking modes under supervisory control provided by a baseband processor (not shown).

Figure 4:
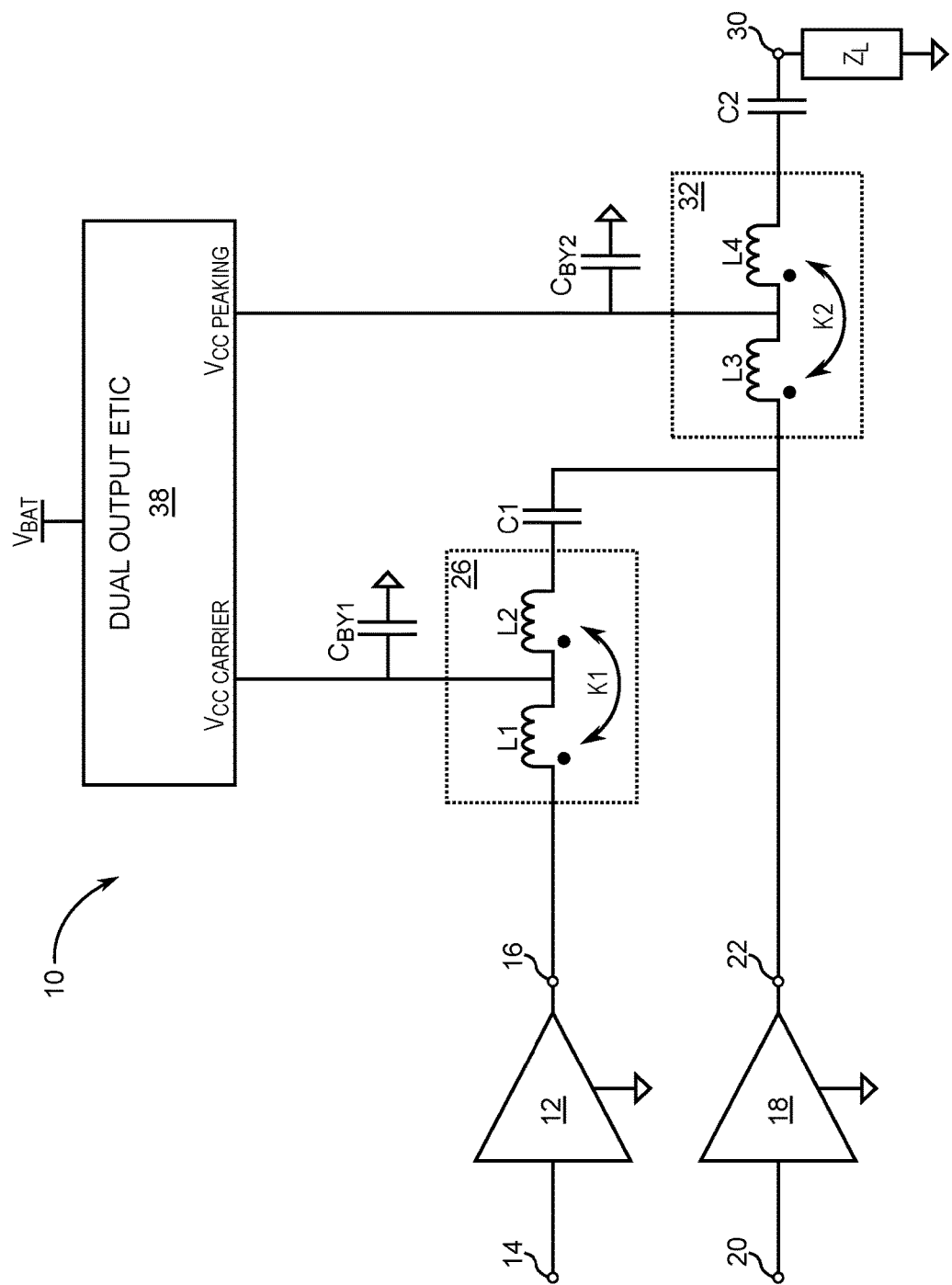
FIG. 4 is a schematic of the exemplary second embodiment of the Doherty amplifier system that is also configured to operate with supply voltage modulation for improved power efficiency by way of a dual output envelope tracking integrated circuit.

FIG. 4 is a schematic of the exemplary second embodiment of the Doherty amplifier system 10 that is also configured to operate with supply voltage modulation for improved power efficiency. However, in this case, the battery voltage $V_{BAT}$ is modulated by a dual output ETIC 38 that is configured to output the carrier supply voltage $V_{CC\_CARRIER}$ and the peaking supply voltage $V_{CC\_PEAKING}$. Similar to the embodiment of FIG. 3, the dual output ETIC 38 may be configured to operate under a plurality of tracking modes that include, but are not limited to, envelope tracking and average power tracking modes. Also, the appropriate tracking mode for a particular envelope tracking environment is selected from the plurality of tracking modes under supervisory control provided by a baseband processor (not shown).

Figure 5:
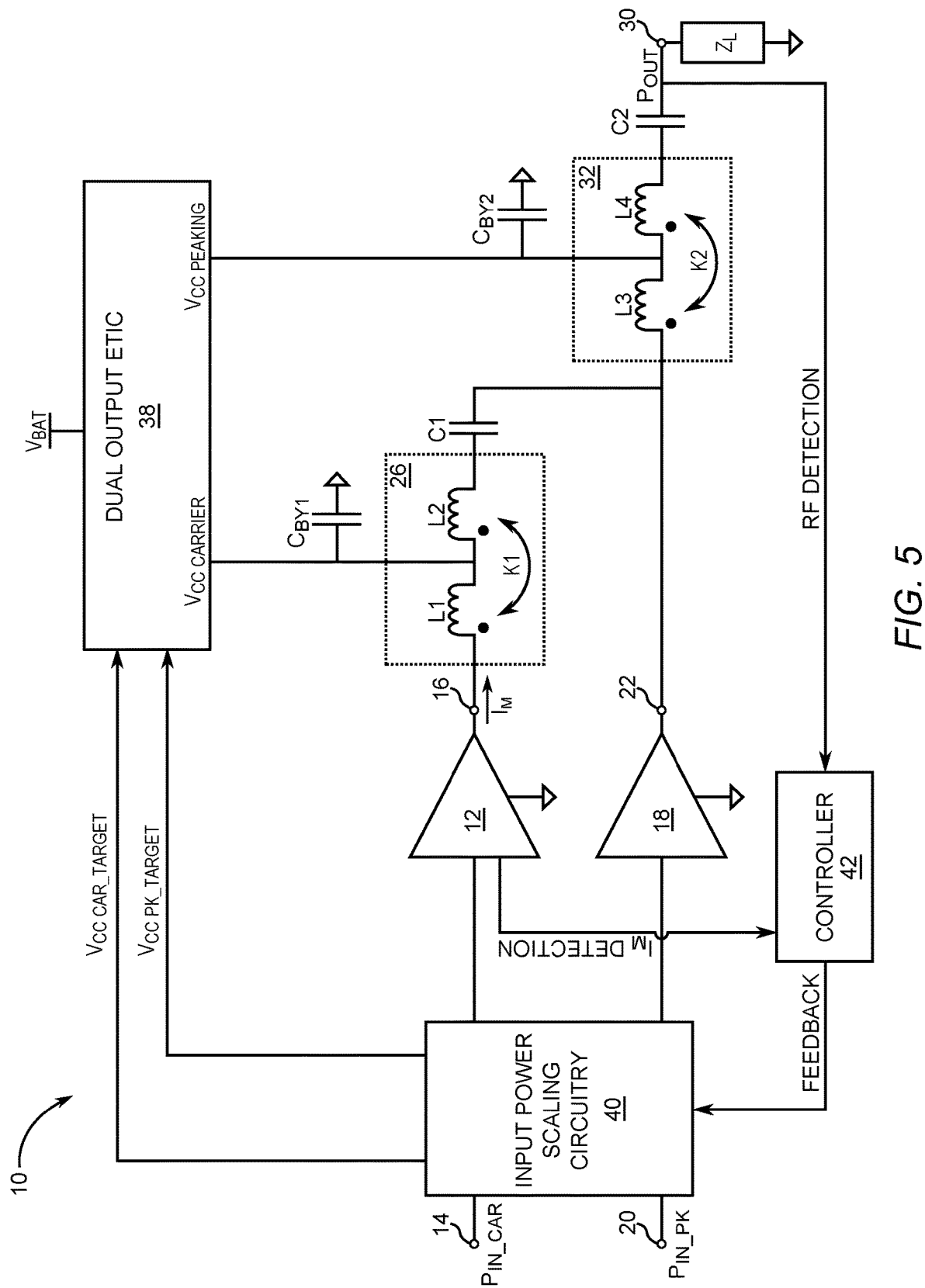
FIG. 5 is a schematic of the exemplary second embodiment of the Doherty amplifier system that is further modified to include input power scaling circuitry and a controller that together are configured to adjust input power levels provided to the carrier amplifier and the peaking amplifier.

FIG. 5 is a schematic of the exemplary second embodiment of the Doherty amplifier system 10 that is further modified to include input power scaling circuitry 40 and a controller 42 that together are configured to adjust input power levels provided to the carrier amplifier 12 and the peaking amplifier 18. The input power scaling circuitry 40 is coupled between the carrier amplifier 12 and the main input 14 and between the peaking amplifier 18 and the peaking input 20. The input power scaling circuitry 40 is configured to scale a carrier input power signal $P_{IN\_CAR}$ and a peaking input power signal $P_{IN\_PK}$ in response to a feedback signal generated by the controller 42. The controller 42 is configured to receive an RF detection signal and a main current $I_M$ detection signal and in response to provide the feedback signal to input power scaling circuitry 40. The RF detection signal may be RF voltage that is proportional with an output signal $P_{OUT}$ that is provided at the RF signal output 30. Moreover, the main current $I_M$ detection signal may be a voltage signal proportional to the main current $I_M$ that flows from the main output 16 of the carrier amplifier 12 during operation. It is to be understood that the RF detection signal, the $I_M$ detection signal, and the feedback signal may be of the analog or digital type and combinations thereof.

Adjustments to the carrier input power signal $P_{IN\_CAR}$ and the peaking input power signal $P_{IN\_PK}$ are automatically scaled by the input power scaling circuitry 40 to maintain linearity of the output signal $P_{OUT}$ provided at the RF signal output 30. The input power scaling circuitry 40 is also configured to provide the dual output ETIC 38 with a carrier voltage target signal $V_{CC\_CAR\_TARGET}$ and a peaking voltage target target $V_{CC\_PK\_TARGET}$ that modulate the carrier supply voltage $V_{CC\_CARRIER}$ and the peaking supply voltage $V_{CC\_PEAKING}$. In particular, the input power scaling circuitry 40 is configured to continuously scale the carrier voltage target signal $V_{CC\_CAR\_TARGET}$ and the peaking voltage target signal $V_{CC\_PK\_TARGET}$ in response to the carrier input power signal $P_{IN\_CAR}$ and the peaking input power signal $P_{IN\_PK}$, respectively.

Those skilled in the art will recognize improvements and modifications to the preferred embodiments of the present disclosure. All such improvements and modifications are considered within the scope of the concepts disclosed herein and the claims that follow.

What is claimed is:

1. A Doherty amplifier system comprising:
   a carrier amplifier having a main input and a main output, wherein the carrier amplifier is configured to amplify a first portion of a radio frequency (RF) signal received at the main input;
   a peaking amplifier having a peaking input and a peaking output, wherein the peaking amplifier is configured to amplify a second portion of the RF signal when the RF signal is above a power level threshold;
   a first inductor coupled between the main output and a first middle node;
   a second inductor coupled between the first middle node and the peaking output, wherein the first inductor and the second inductor are configured to have a first magnetic coupling to form a first impedance inverter;
   a third inductor coupled between the peaking output and a second middle node; and
   a fourth inductor coupled between the second middle node and an RF signal output, wherein the third inductor and the fourth inductor are configured to have a second magnetic coupling to form a second impedance inverter, wherein a first impedance inverter coefficient of the first impedance inverter is numerically within ±10% of a second impedance inverter coefficient of the second impedance inverter.

2. The Doherty amplifier system of claim 1 wherein the first middle node and the second middle node are direct current coupled to ground.

3. The Doherty amplifier system of claim 1 further comprising:
a first RF grounding capacitor coupled between the first middle node and ground; and
a second RF grounding capacitor coupled between the second middle node and ground.

4. The Doherty amplifier system of claim 1 wherein the first magnetic coupling between the first inductor and the second inductor is negative.

5. The Doherty amplifier system of claim 1 wherein the second magnetic coupling between the third inductor and fourth inductor is negative.

6. The Doherty amplifier system of claim 1 further comprising:
a first capacitor coupled between the second inductor and the peaking output; and
a second capacitor coupled between the fourth inductor and the RF signal output.

7. The Doherty amplifier system of claim 6 further comprising;
a third capacitor coupled between the main output and the first inductor; and
a fourth capacitor coupled between the peaking output and the third inductor.

8. The Doherty amplifier system of claim 1 wherein the carrier amplifier is configured to receive power from a carrier voltage source coupled to the first middle node and the peaking amplifier is configured to receiver power from a peaking voltage source coupled to the second middle node.

9. The Doherty amplifier system of claim 8 further comprising a first envelope tracking integrated circuit coupled between a battery voltage source and the first middle node, wherein the first envelope tracking integrated circuit is configured to modulate a battery voltage of the battery voltage source in response to a carrier input signal received at the main input.

10. The Doherty amplifier system of claim 9 further comprising a second envelope tracking integrated circuit coupled between the battery voltage source and the second middle node, wherein the second envelope tracking integrated circuit is configured to modulate the battery voltage in response to a peaking input signal received at the main input.

11. The Doherty amplifier system of claim 8 wherein the first inductor is direct current coupled to the main output of the carrier amplifier.

12. The Doherty amplifier system of claim 8 wherein the third inductor is direct current coupled to the peaking output of the peaking amplifier.

13. The Doherty amplifier system of claim 8 further comprising input power scaling circuitry coupled between the carrier amplifier and the main input and between the peaking amplifier and the peaking input, wherein the input power scaling circuitry is configured to scale a carrier input power signal and a peaking input power signal in response to a feedback signal generated by a controller.

14. The controller of claim 13, is configured to generate the feedback signal in response to an RF detection signal that is proportional to an output signal provided at the RF signal output.

15. The Doherty amplifier system of claim 14 wherein the controller is further configured to generate the feedback signal in response to a main current detection signal that flows from the main output of the carrier amplifier during operation.

16. The Doherty amplifier system of claim 15 further comprising a dual output envelope tracking integrated circuit coupled between a battery voltage source and the first middle node and the second middle node, wherein the dual output envelope tracking integrated circuit has a first output coupled to the first middle node and a second output coupled to the second middle node and is configured to modulate a battery voltage of the battery voltage source in response to a carrier voltage target signal and a peaking voltage target signal.

17. The Doherty amplifier system of claim 16, wherein the dual output envelope tracking integrated circuit includes an envelope tracking mode and an average power tracking mode.

18. The Doherty amplifier system of claim 16, wherein the input power scaling circuitry is further configured to generate the carrier voltage target signal and the peaking voltage target signal in response to continuous scaling of the carrier input power signal and the peaking input power signal, respectively.

\* \* \* \* \*